United States Patent
Nierle et al.

(10) Patent No.: US 7,263,019 B2
(45) Date of Patent: Aug. 28, 2007

(54) SERIAL PRESENCE DETECT FUNCTIONALITY ON MEMORY COMPONENT

(75) Inventors: Klaus Nierle, Essex Junction, VT (US); Martin Versen, Feldkirchen-Westerham (DE)

(73) Assignee: Infineon Technologies AG, Munich (DE)

( * ) Notice: Subject to any disclaimer, the term of this patent is extended or adjusted under 35 U.S.C. 154(b) by 155 days.

(21) Appl. No.: 11/227,585

(22) Filed: Sep. 15, 2005

(65) Prior Publication Data

US 2007/0058470 A1 Mar. 15, 2007

(51) Int. Cl.
*G11C 7/00* (2006.01)
(52) U.S. Cl. .................. 365/221; 710/71; 711/100; 370/366
(58) Field of Classification Search ........... 365/221; 370/366; 710/71; 711/100
See application file for complete search history.

(56) References Cited

U.S. PATENT DOCUMENTS

| 6,260,127 B1 * | 7/2001 | Olarig et al. ............... 711/167 |
| 2005/0044302 A1 * | 2/2005 | Pauley et al. ................. 711/1 |
| 2005/0138267 A1 * | 6/2005 | Bains et al. ................ 711/100 |

OTHER PUBLICATIONS

Joint Electron Device Engineering Council (JEDEC) STANDARD No. 21-C (Section 4.1.2 Serial Presence Detect Standard, General Standard), Release 7r9, printed Dec. 12, 2005, available at http://www.jedec.org/download/search/4_02_00R9.pdf.

* cited by examiner

*Primary Examiner*—Van Thu Nguyen
*Assistant Examiner*—Eric J. Wendler
(74) *Attorney, Agent, or Firm*—Patterson & Sheridan, L.L.P.

(57) ABSTRACT

Methods and apparatus for accessing serial presence detect data are provided. For some embodiments, serial presence detect logic is incorporated in memory devices, eliminating the need for a separate serial presence detect component.

23 Claims, 5 Drawing Sheets

SERIAL PRESENCE DETECT FUNCTIONALITY ON MEMORY COMPONENT

BACKGROUND OF THE INVENTION

1. Field of the Invention

The invention generally relates to memory modules utilizing a serial presence detect (SPD) mechanism and, more particularly, to integrating SPD functionality in a memory component.

2. Description of the Related Art

A memory module generally refers to an assembly of memory devices on a single printed circuit board (PCB). Many types of memory modules adhere to standards that specify various electrical properties and particular physical dimensions of the PCB and connector (referred to as a form factor). The standards also specify various electrical characteristics, such as the number of pins on a connector, a particular pinout (what signals are routed to each pin), various voltage levels, memory configurations, operating speed, and the like. The characteristics of various memory modules may vary widely. For example, a conventional single inline memory module (SIMM) typically allows the simultaneous transfer of 32-bits of data, while a conventional dual inline memory module (DIMM) typically allows the simultaneous transfer of 64-bits of data.

To reduce cost and speed the time to market, it is often desirable to incorporate new memory technologies into existing memory module form factors rather than develop (or before developing) new ones. Unfortunately, upon initial design of a module, it may be difficult to foresee all of the possible memory technologies (including those not yet developed) the module may be called on to support. In order to accommodate new memory technologies, some memory module standards call for a serial presence detect (SPD) scheme, in which information about various features and attributes of a particular memory technology supported by the memory module is stored on the memory module, typically in a separate memory component.

For example, FIG. 1 illustrates an exemplary conventional memory module 100 having a plurality of memory devices 110 and a separate SPD (memory) component 120. The SPD component 120 may include a set of parameters that define how the module 100 may be accessed to read and write data to/from the memory devices 110. These parameters may include access speed, memory size, configuration, and manufacturer data, for example, as specified in Joint Electron Device Engineering Council (JEDEC) STANDARD No. 21-C (Section 4.1.2 SERIAL PRESENCE DETECT STANDARD, General Standard), incorporated herein by reference.

Data in the SPD component 120 may be accessed via serial interface lines 122, for example, coupling a plurality of control pins of the SPD component 120 to conductive "fingers" 132 of a connector 130. For example, when a computer system is initialized at power-up (booted), the information stored in the SPD component 120 may be polled by the basic input/output system (BIOS) to determine the size, data width, speed, and voltage requirements of the module 100. The BIOS may use this information to configure the memory properly for maximum reliability and performance. If a memory module does not have an SPD component 120, the computer may not boot or the BIOS may be configured to assume default values for these parameters which may cause problems for the memory modules (e.g., suboptimal performance).

The illustrated SPD scheme may allow various different memory technologies to be incorporated in a standard form factor. For example, different arrangements of possibly different memory devices (e.g., different data widths) may be assembled on the same form factor, with each different arrangement having different SPD data written in its SPD component 120 to identify its operating parameters. However, the scheme suffers from a number of drawbacks. As an example, the addition of SPD component 120 increases PCB space and adds to the overall cost to the module 100. Further, the addition of SPD component 120 leads to additional inventory overhead as it represents another part that must be stocked.

Accordingly, what is needed is an improved technique for storing and reading out memory module parameters (e.g., an improved SPD scheme).

SUMMARY OF THE INVENTION

Embodiments of the invention generally provide methods and apparatus for accessing serial presence detect data.

One embodiment provides a memory module generally including a printed circuit board, a connector coupled to or integrated with the printed circuit board, and a plurality of memory devices mounted on the printed circuit board. At least one of the memory devices includes non-volatile storage elements for storing serial presence detect data indicating one or more parameters relating to operation of the memory module, and further includes serial interface control pins electrically coupled to the connector for providing access to the serial presence detect data stored in the non-volatile storage elements.

Another embodiment provides a memory device generally including one or more memory arrays, control circuitry for exchanging data in parallel between a set of data pins and the memory arrays, and non-volatile storage elements for storing serial presence detect data. The memory device also includes serial interface logic for providing serial access to the serial presence detect data stored in the non-volatile storage elements via a set of control pins.

Another embodiment provides a dynamic random access memory (DRAM) device generally including one or more memory arrays, control circuitry for exchanging data in parallel between a set of data pins and the memory arrays, electrically programmable fuses for storing serial presence detect data, and serial interface logic for providing serial access to the serial presence detect data stored in the electrically programmable fuses via a set of control pins.

Another embodiment provides a memory device generally including one or more memory arrays, means for exchanging data in parallel between a set of data pins and the memory arrays, non-volatile storage means for storing serial presence detect data, and means for providing serial access to serial presence detect data stored in the non-volatile storage means via a set of control pins.

Another embodiment provides a method for providing access to serial presence detect data of a memory module. The method generally includes mounting a plurality of memory devices on a printed circuit board of the memory module, wherein at least one of the memory devices includes non-volatile storage elements for storing serial presence detect data indicating one or more parameters relating to operation of the memory module, and electrically coupling serial interface control pins of at least one memory device to a connector of the memory module to provide access to the serial presence detect data stored in the non-volatile storage elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide methods and apparatus for integrating serial presence detect (SPD) functionality within memory devices. For some embodiments, memory devices include non-volatile storage elements, such as electrically programmable fuses (eFuses) to store SPD data. These storage elements may be polled in a similar manner to conventional separate SPD components (e.g., via a serial interface), thus making the integration of SPD functionality into memory devices transparent to external devices. In one embodiment, the need for a separate SPD component is eliminated so that PCB size, overall cost of the memory module, and inventory overhead may all be reduced.

To facilitate understanding, embodiments may be described below with reference to dual inline memory modules (DIMMs) including DRAM devices, as a specific, but not limiting example of a type of memory module in which the SPD schemes described herein may be used to advantage. However, those skilled in the art will recognize these techniques may be applied in a wide variety of memory modules that utilize a wide variety of different type memory devices. Further, while embodiments may be described with reference to storing SPD data in eFuses, SPD data may also be stored in various other type non-volatile storage elements.

An Exemplary Memory Module

Figure 2:
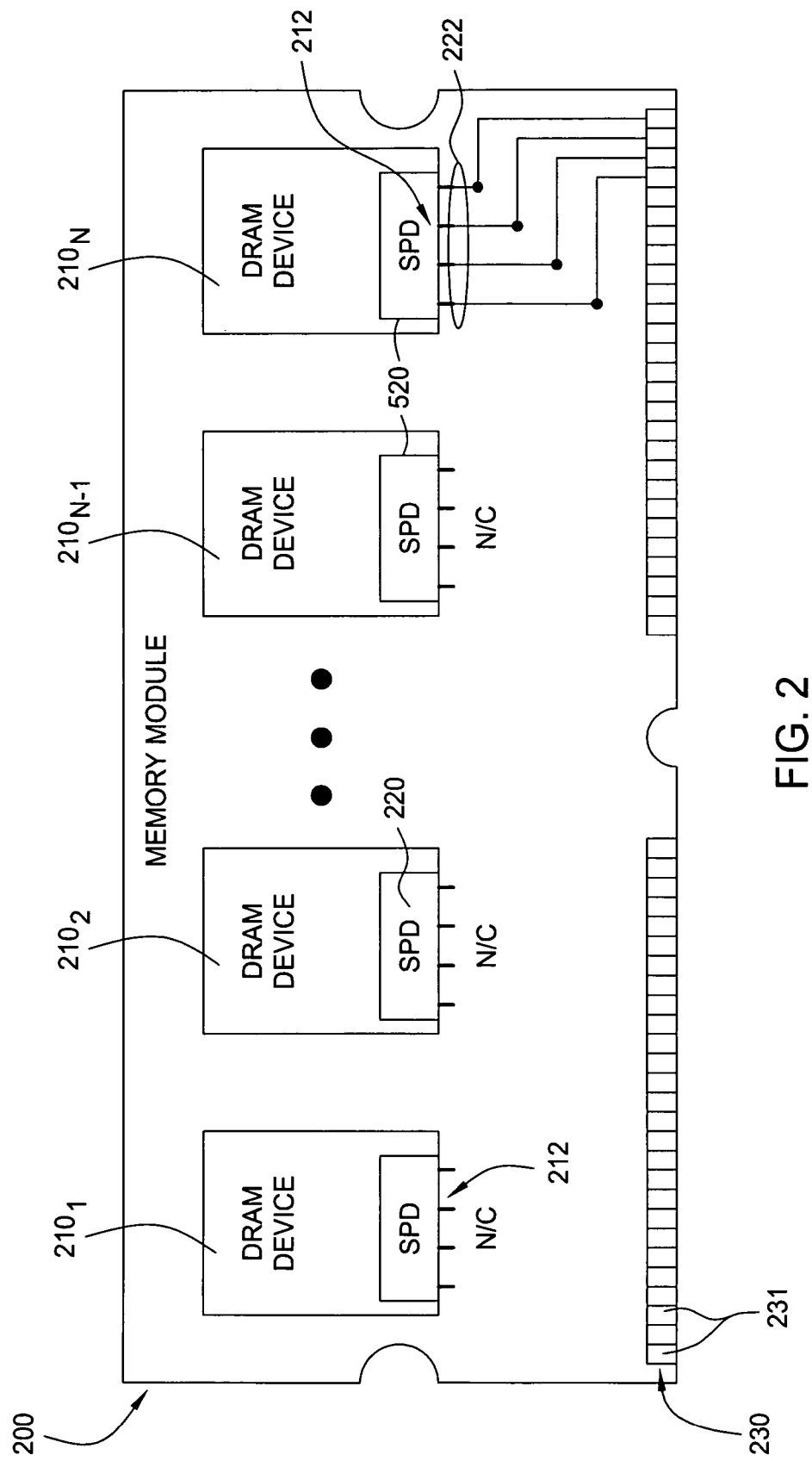
FIG. 2 illustrates an exemplary memory module utilizing an SPD scheme in accordance with one embodiment of the present invention.

FIG. 2 illustrates an exemplary memory module 200 with memory devices $210_{1-N}$ incorporating SPD functionality in accordance with embodiments of the present invention. For illustrative purposes only, the memory devices $210_{1-N}$ are shown as DRAM devices. As is well known in the art, the value for N may depend on the particular configuration of memory module 200, as well as the configuration of the particular devices $210_{1-N}$.

As illustrated, each device 210 may include internal SPD logic 220, thus eliminating the need for a separate SPD component. For some embodiments, one or more of the memory devices $210_{1-N}$ may not include SPD logic 220. However, including SPD logic 220 in each device may simplify design and reduce inventory overhead by eliminating the need to stock separate devices (i.e., some devices with the SPD logic 220 and others without). Further, depending on the particular embodiment, the actual SPD data describing the memory module 200 may be stored in the SPD logic 220 contained in only one, only some, or all of the memory devices 210. Accordingly, the SPD logic 220 of only one, only some, or all of the memory devices 210 may need to be accessed to retrieve the SPD data.

Data stored in SPD logic 220 of a memory device 210 may be accessed via serial interface lines 222, for example, coupling a plurality of control pins 212 of the memory device $210_N$ to conductive fingers 232 of a connector 230. The control pins 212 may be used to implement any type of standard serial protocol (e.g., I2C, SPI, or the like) or proprietary protocol and will typically include a clock line (SCK), at least one data line (SDA). In some cases, the serial interface lines 222 may include one or more address lines, for example, used to identify a particular memory module (e.g., out of multiple modules in a system or motherboard). As an alternative, address information may be transmitted via data lines (e.g., as the first few bits of data).

Figure 1:
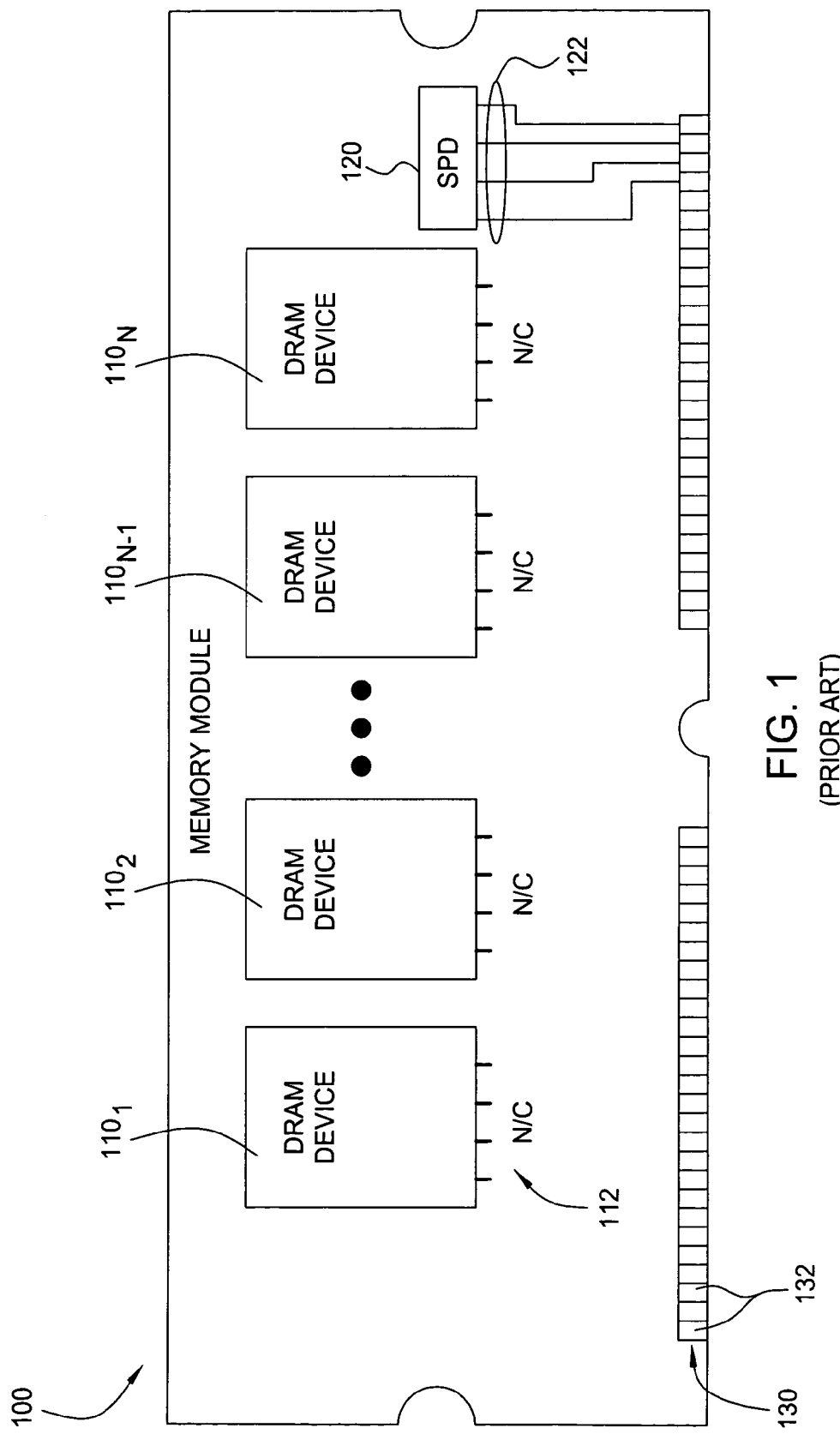
FIG. 1 illustrates an exemplary memory module utilizing a serial presence detect (SPD) scheme in accordance with the prior art.

In some cases, previously unused pins of a conventional device (e.g., unused pins 112 of the memory devices 110 shown in FIG. 1) may be utilized as the control pins 212, thus allowing SPD functionality to be implemented without the need to increase overall pin count of the memory devices 210. In the illustrated example, the SPD component 220 of only one memory device $210_N$ is accessible, with the control pins 212 of the other devices $210_1$-$210_{N-1}$ shown as not connected (N/C). To reduce routing length of the serial interface lines 222, the memory device 210 whose control lines 212 are connected may be the one that is physically the closest to the corresponding connector fingers 232 used for the serial interface.

In some cases, the SPD logic 220 may be configured to emulate a conventional (i.e., separate) SPD component. In other words, the serial protocol used and contents and arrangement of the SPD data contained in the SPD logic 220 may be the same as in conventional SPD components. As a result, an external device may access the SPD logic 220 as it would a conventional separate SPD component 120, allowing the use of existing mechanisms (e.g., a CPU may poll the SPD logic 220 using existing BIOS code). In some cases, the SPD logic 220 may conform to a standard, such as the JEDEC standard for SPD (See previously referenced JEDEC Standard No. 21-C).

An Exemplary Memory Device

Figure 3:
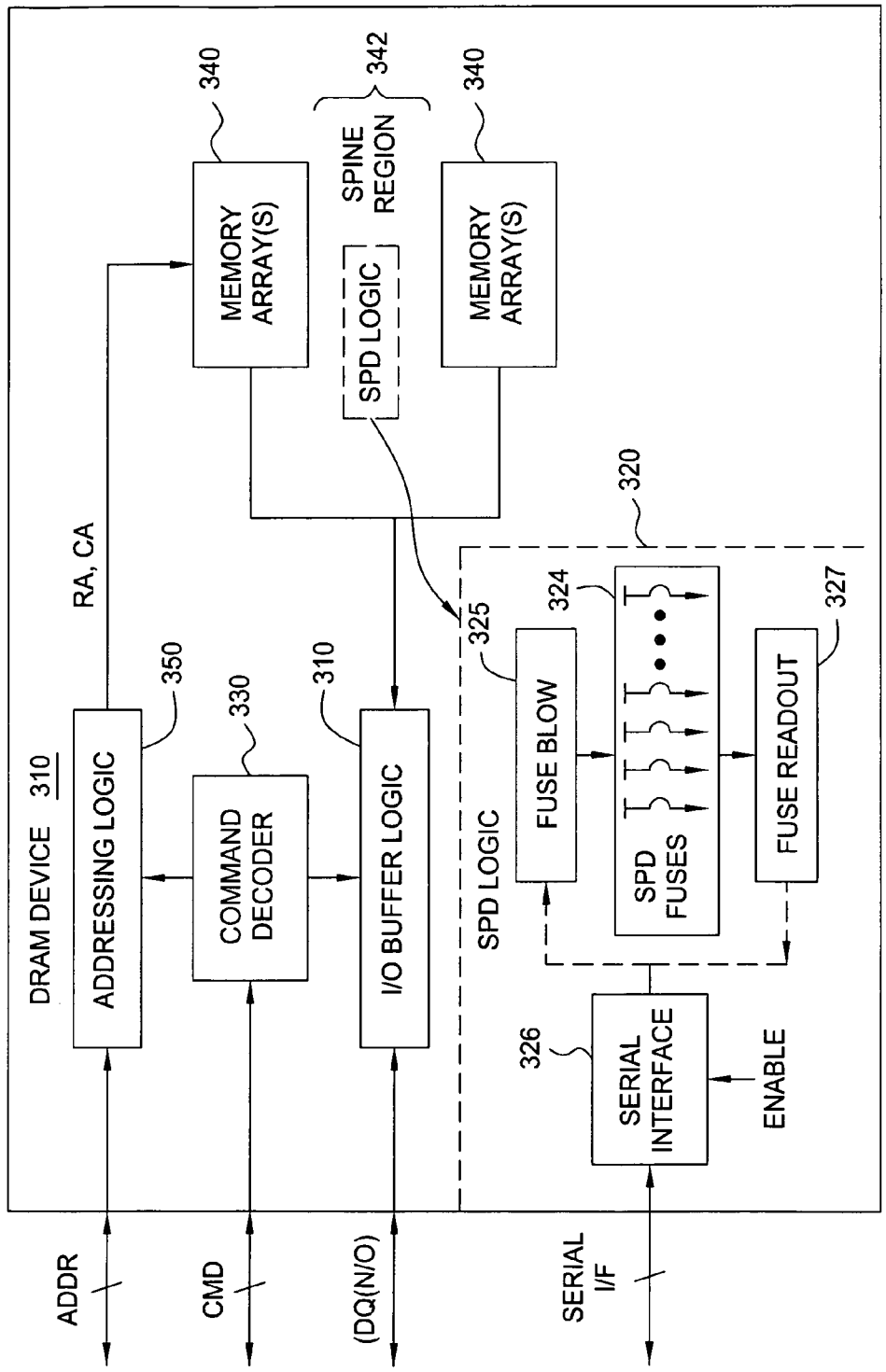
FIG. 3 illustrates an exemplary dynamic random access memory (DRAM) device incorporating SPD functionality in accordance with one embodiment of the present invention.

FIG. 3 is a block diagram of an exemplary DRAM device 310 that illustrates exemplary components used to implement SPD logic 320 in accordance with one embodiment. As illustrated, other (non-SPD) components of the DRAM device 310 may operate in a conventional manner.

For example, the device 310 may include a command decoder 330 to receive a set of control signals to access (e.g., read, write, or refresh) data stored in memory arrays 340 at locations specified by a set of address signals. The address signals may be latched by addressing logic 350 and converted into row address signals (RA) and column address signals (CA) used to access individual cells in the arrays 340. Data presented as data signals (DQ<N:O>) read from and written to the arrays 340 may be transferred between external data pads and the arrays 340 via I/O buffering logic 360.

In some cases, to optimize layout and signal routing efficiency, the arrays 340 may be arranged around a central spine region 342. To conserve space, for some embodiments, components of the SPD logic 320 and corresponding signal traces may be physically located within the spine region 342. As previously described, to avoid increasing pin count, the SPD logic 320 may use package pins that would otherwise be electrically unconnected. As an example, some standard DRAM packages (e.g., 1GBit DDR2 chip packages), include four unused support pins (spacer pins placed at the extreme of the package to provide structural support), which are not electrically connected. For some embodiments, such pins may be used as control pins and may, therefore, be electrically connected to serial interface logic 326 of the SPD logic 320. Of course, adding additional pins for the SPD logic 320 is also contemplated.

To store parameters that indicate how a memory module having a plurality of devices 310 operates (i.e., SPD data), the SPD logic 320 may include a set of non-volatile storage elements. For example, as illustrated in FIG. 3, the SPD logic 320 may include a set of electrically programmable fuses 324. The contents 324 of the fuses 324 may be read out by an external device (e.g., a GPU or memory controller) using fuse readout circuitry 327, which may include any suitable circuitry, for example, to address/select individual fuses, latch values indicating the corresponding fuse states (e.g., '1' for blown, '0' for not-blown, or vice-versa), and provide the values to the serial interface 326.

For some embodiments, the SPD logic 320 may also include fuse blow circuitry 325 allowing one or more of the fuses 324 to be blown. The fuse blow circuitry 325 may include any suitable circuitry to alter individual fuse states to allow SPD data (e.g., written via the serial interface 326) to be stored into fuses 324. For some embodiments, a portion of the fuses 324 may be reserved for SPD data, while a remaining portion may be available for relatively unrestricted ("scratchpad") use. For example, a lower 128 bits may be secured (with writing not allowed) and reserved for SPD data, while a remaining portion may be writable (albeit one-time writable). This may allow a manufacturer, for example, to store diagnostic data, such as information related to detected failures and the like, in this unrestricted area. This information may be read out at a later time to assist in diagnosing problems. This approach may be particularly useful when an initial release (i.e., "BETA versions") of a memory module (or of a memory device thereon) is being evaluated.

For some embodiments, the SPD fuses 324 may be included with a bank of other fuses (not shown) used for various other purposes to affect operation of the DRAM device 310, such as redundancy/repair, trimming voltage levels, adjusting timing, and the like. Further, for some embodiments, other types of non-volatile storage elements may be used to store SPD data, such as EEPROM, flash memory, or laser-cut fuses.

Figure 4:
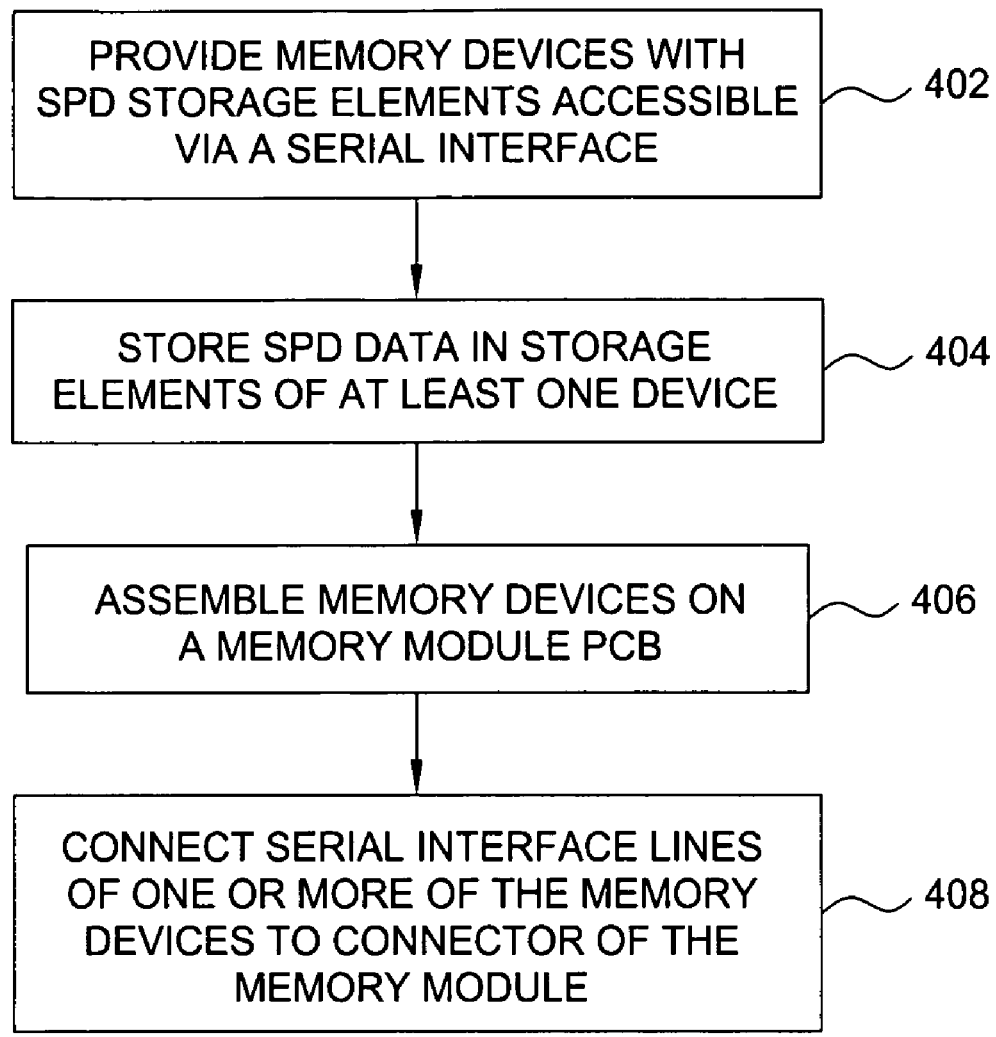
FIG. 4 illustrates exemplary operations for assembling a memory module in accordance with one embodiment of the present invention.

FIG. 4 is a flow diagram of exemplary operations that may be performed to assemble a memory module that includes a set of memory devices with integrated SPD functionality in accordance with embodiments of the present invention. The operations begin, at step 402, by providing memory devices with SPD storage elements accessible via a serial interface. At step 404, SPD data is stored in at least one of the devices. At step 406, the memory devices are assembled on a memory module PCB, with the serial interface lines of one or more of the memory devices coupled to a connector of the memory module.

The particular operations shown if FIG. 4, as well as the order in which they are shown, are exemplary only and may be varied for different embodiments. For example, for some embodiments, SPD data may be written to one or more of the memory devices prior to assembling them on the memory module PCB. However, writing the SPD data after assembly may provide more flexibility, for example, allowing SPD data to be determined and written "just in time."

Figure 5:
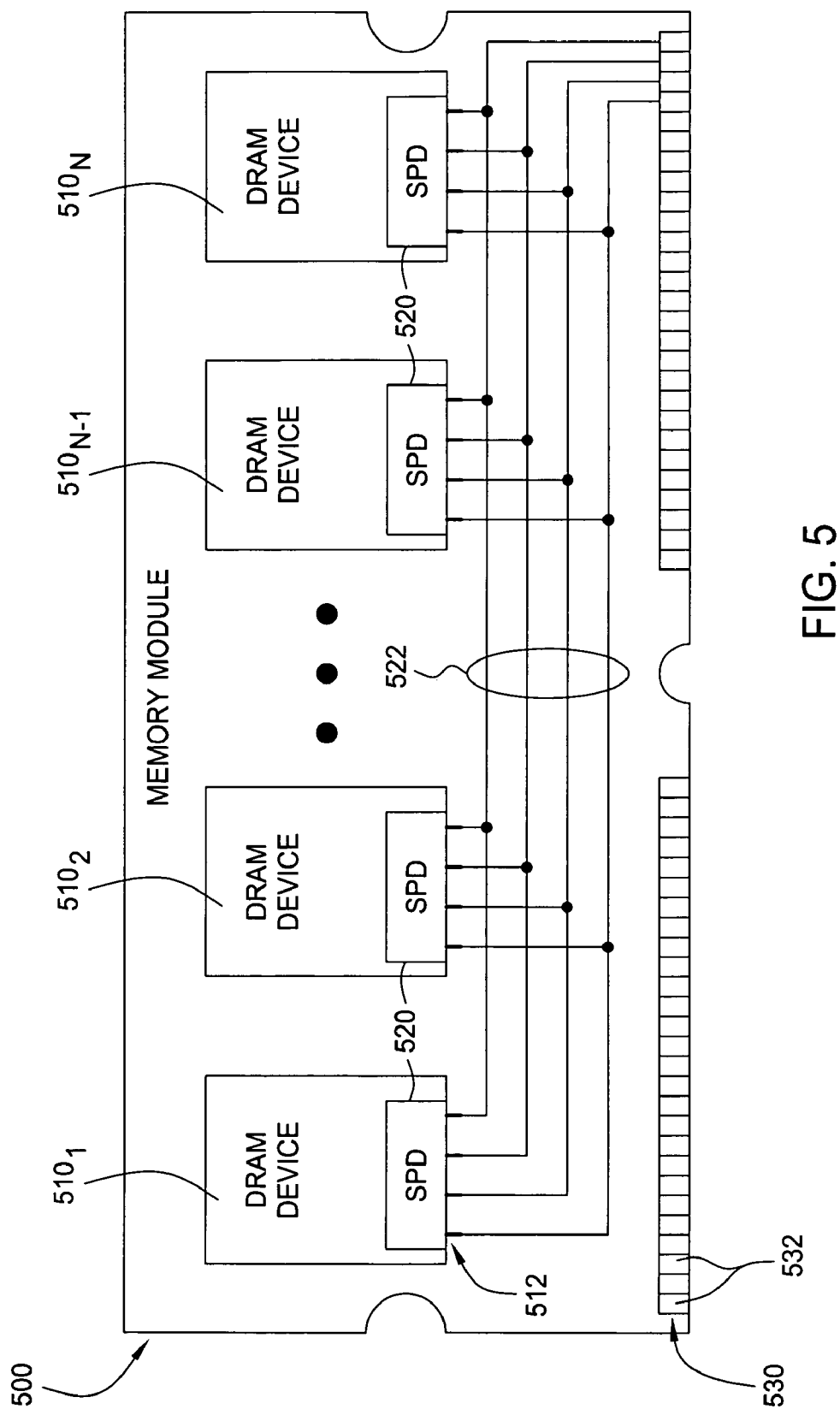
FIG. 5 illustrates another exemplary memory module utilizing an SPD scheme in accordance with one embodiment of the present invention.

In some cases, flexibility may also be provided by providing access to SPD logic of more than one memory device. For example, as illustrated in FIG. 5, a memory module 500 may include common serial interface lines 522 routed to (serial interface) control pins 512 of each memory device 510. As a result, it may be possible to access SPD logic 520 in more than one memory device 510. This may be advantageous, for example, in the event that it is necessary to update SPD data for a memory module for any reason, after the (write-only) SPD storage elements for one memory device 510 have been blown.

However, for some embodiments, it may be desirable to access the SPD logic 520 of only one memory device 510 at a time, for example, to simplify logic and avoid contention. Therefore, some mechanism may be provided on the memory module 500 and/or each memory device 510, to allow the SPD logic 520 of only a single memory device to be accessed at any time. Such a mechanism may allow the serial interface of SPD logic 520 of a memory device 510 that contains SPD data that is invalid (obsolete or outdated) to be disabled. Valid SPD data may then be stored in the SPD logic 520 of a different memory device 510.

A wide variety of such mechanisms may be utilized to select the SPD logic 520 of an individual memory device. For example, for one embodiment, physical jumpers may be used to connect the control pins 512 of a selected memory device 510 to the common serial interface lines 522. For another embodiment, a fusing scheme may be employed whereby master fuses are used to enable/disable the serial interface for each device 510. For example, blowing a first such fuse may enable the serial interface logic for a selected device 510, while blowing a second such fuse may disable the serial interface logic. As a result, serial interface logic may be enabled once (by blowing the first fuse), SPD data written to storage elements of the corresponding SPD logic 520, and subsequently disabled (by blowing the second fuse) if that SPD data becomes obsolete.

CONCLUSION

By incorporating SPD functionality within memory devices of a memory module, the need for a separate SPD component may be eliminated. As a result, the overall cost of the memory module may be reduced.

While the foregoing is directed to embodiments of the present invention, other and further embodiments of the invention may be devised without departing from the basic scope thereof, and the scope thereof is determined by the claims that follow.

What is claimed is:

1. A memory module, comprising:
   a printed circuit board;
   a connector coupled to or integrated with the printed circuit board; and
   a plurality of memory devices mounted on the printed circuit board, wherein at least one of the memory devices includes non-volatile storage elements for storing serial presence detect data indicating one or more parameters relating to operation of the memory module and serial interface control pins electrically coupled to the connector for providing access to the serial presence detect data stored in the non-volatile storage elements.

2. The memory module of claim 1, wherein the non-volatile storage elements comprise fuses.

3. The memory module of claim 1, wherein more than one of the memory devices includes non-volatile storage elements for storing the serial presence detect data and serial interface control pins.

4. The memory module of claim 1, wherein the non-volatile storage elements of at least one of the memory devices are writable after the memory devices have been mounted to the printed circuit board.

5. The memory module of claim 2, wherein the non-volatile storage elements comprise electrically programmable fuses.

6. The memory module of claim 4, wherein the serial interface control pins of only one of the memory devices is electrically coupled to the connector.

7. A memory device, comprising:
   one or more memory arrays;
   control circuitry for exchanging data in parallel between a set of data pins and the memory arrays;
   non-volatile storage elements for storing serial presence detect data; and
   serial interface logic for providing serial access to serial presence detect data stored in the non-volatile storage elements via a set of control pins.

8. The memory device of claim 7, wherein:
   a spine region is formed between the one or more memory arrays; and
   the non-volatile storage elements are located in the spine region.

9. The memory device of claim 7, wherein the non-volatile storage elements comprise electrically programmable fuses.

10. The memory device of claim 7, wherein the control pins are located at pin locations previously occupied by pins not electrically connected to logical circuitry in one or more previous versions of memory device.

11. The memory device of claim 7, further comprising one or more fuse elements for enabling and/or disabling the serial interface logic.

12. A dynamic random access memory (DRAM) device, comprising:
    one or more memory arrays;
    control circuitry for exchanging data in parallel between a set of data pins and the memory arrays;
    electrically programmable fuses for storing serial presence detect data; and
    serial interface logic for providing serial access to serial presence detect data stored in the electrically programmable fuses via a set of control pins.

13. The DRAM device of claim 12, wherein:
    a spine region is formed between the one or more memory arrays; and
    the electrically programmable fuses are located in the spine region.

14. The DRAM device of claim 12, wherein the control pins are located at pin locations previously occupied by pins not electrically connected to logical circuitry in one or more previous versions of DRAM device.

15. The DRAM device of claim 12, wherein the serial interface logic provides access to serial presence detect data in accordance with a Joint Electron Device Engineering Council (JEDEC) standard related to serial presence detect data.

16. A memory device, comprising:
    one or more memory arrays;
    means for exchanging data in parallel between a set of data pins and the memory arrays;
    means for storing serial presence detect data; and
    means for providing serial access to serial presence detect data stored in the means for storing via a set of control pins.

17. The memory device of claim 16, wherein the control pins are located at pin locations previously occupied by pins not electrically connected to logical circuitry in one or more previous versions of memory device.

18. The memory device of claim 16, further comprising means for enabling and/or disabling the serial interface means.

19. A method for providing access to serial presence detect data of a memory module, comprising:
    mounting a plurality of memory devices on a printed circuit board of the memory module, wherein at least one of the memory devices includes non-volatile storage elements for storing serial presence detect data indicating one or more parameters relating to operation of the memory module; and
    electrically coupling serial interface control pins of at least one memory device to a connector of the memory module to provide access to serial presence detect data stored in the non-volatile storage elements thereof.

20. The method of claim 19, wherein electrically coupling serial interface control pins of at least one memory device to a connector of the memory module comprises electrically coupling serial interface control pins of a plurality of memory devices to the connector via a common set of serial interface lines.

21. The method of claim 19, wherein:
    more than one of the plurality of memory devices mounted on the printed includes non-volatile storage elements for storing serial presence detect data; and
    electrically coupling serial interface control pins of at least one memory device to the connector comprises electrically coupling serial interface control pins of only one memory device to the connector.

22. The method of claim 19, further comprising storing a first set of serial presence detect data in non-volatile storage elements of a first memory device after mounting the memory devices on the memory module.

23. The method of claim 22, further comprising storing a second set of serial presence detect data in non-volatile storage elements of a second memory device after storing the first set of serial presence detect data in non-volatile storage elements of the first memory device.

* * * * *